(12) United States Patent
Luo et al.

(10) Patent No.: US 11,875,869 B2
(45) Date of Patent: Jan. 16, 2024

(54) INSULATED GATE BIPOLAR TRANSISTOR PHYSICAL MODEL

(71) Applicant: Naval University of Engineering, Wuhan (CN)

(72) Inventors: Yifei Luo, Wuhan (CN); Fei Xiao, Wuhan (CN); Binli Liu, Wuhan (CN); Yongle Huang, Wuhan (CN); Xin Li, Wuhan (CN); Yingjie Jia, Wuhan (CN); Jing Pu, Wuhan (CN); Youxing Xiong, Wuhan (CN)

(73) Assignee: NAVAL UNIVERSITY OF ENGINEERING, Wuhan (CN)

( * ) Notice: Subject to any disclaimer, the term of this patent is extended or adjusted under 35 U.S.C. 154(b) by 13 days.

(21) Appl. No.: 17/529,230

(22) Filed: Nov. 17, 2021

(65) Prior Publication Data

US 2022/0076777 A1 Mar. 10, 2022

Related U.S. Application Data

(63) Continuation-in-part of application No. PCT/CN2019/121527, filed on Nov. 28, 2019.

(30) Foreign Application Priority Data

Jul. 31, 2019 (CN) .......................... 201910700605.4

(51) Int. Cl.
- *G06F 30/367* (2020.01)
- *H01L 29/739* (2006.01)
- *G11C 29/54* (2006.01)
- *G06F 30/39* (2020.01)
- *G06F 30/3308* (2020.01)

(52) U.S. Cl.
CPC .......... *G11C 29/54* (2013.01); *G06F 30/3308* (2020.01); *G06F 30/39* (2020.01); *H01L 29/7393* (2013.01)

(58) Field of Classification Search
CPC ....... G11C 29/54; G11C 7/04; G06F 30/3308; G06F 30/39; G06F 30/367; H01L 29/7393; H01L 29/7395
See application file for complete search history.

(56) References Cited

U.S. PATENT DOCUMENTS

2020/0240850 A1 * 7/2020 He ........................... G01K 7/42

FOREIGN PATENT DOCUMENTS

| CN | 102623335 A | * | 8/2012 |
| CN | 104899350 A | * | 9/2015 |

OTHER PUBLICATIONS

Mitter et al., Insulated Gate Bipolar Transistor (IGBT) Modeling Using IG-Spice, IEEE, 1993, pp. 24-33. (Year: 1993).*

(Continued)

*Primary Examiner* — Nghia M Doan
(74) *Attorney, Agent, or Firm* — MATTHIAS SCHOLL P.C.; Matthias Scholl

(57) ABSTRACT

An IGBT physical model parameter extraction method includes obtaining an initial value and a transformation range of an IGBT physical model parameter; and correcting a model parameter by means of a correspondence between IGBT dynamic and static features and the IGBT physical model parameter and in combination with an experiment measurement result of the IGBT physical model parameter.

8 Claims, 12 Drawing Sheets

(56) References Cited

OTHER PUBLICATIONS

Rodriguez et al., Static and Dynamic finite element modeling of thermal fatigue effects in insulated gate bipolar transistor modules, Microelectronic Reliability, Nov. 12, 1999, pp. 445-463 (Year: 1999).*
CN 102623335 (electronic translation) (Year: 2012).*

* cited by examiner

US 11,875,869 B2

INSULATED GATE BIPOLAR TRANSISTOR PHYSICAL MODEL

CROSS-REFERENCE TO RELATED APPLICATIONS

This application is a continuation-in-part of International Patent Application No. PCT/CN2019/121527 with an international filing date of Nov. 28, 2019, designating the United States, now pending, and further claims foreign priority benefits to Chinese Patent Application No. 201910700605.4 filed Jul. 31, 2019. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, MA 02142.

BACKGROUND

The disclosure relates to the field of modeling and reliability of power electronic devices, and more particularly to an IGBT physical model parameter extraction method.

For an IGBT (Insulated Gate Bipolar Transistor) with a certain structure, the internal parameters of the components have a decisive influence on its performance. These parameters include structure size, doping concentration, lifetime of excess carrier, junction capacitance, transconductance, etc., and they will directly affect various dynamic and static performance indicators of the IGBT, such as on-state voltage drop, switching speed, turn-off tail current. Therefore, to establish an accurate IGBT semiconductor physical model and realize an accurate simulation of the electrical characteristics of the IGBT, an accurate extraction of parameters is indispensable. At the same time, the model parameters are also important for the design and manufacturing of the IGBT, the structure and performance optimization, and the safe use of the components.

A semiconductor physical model is a simulation model that characterizes the electrical characteristics of IGBT components. Since the semiconductor physical model can achieve a compromise between the simulation accuracy and the simulation efficiency, it has become a widely used IGBT model. In order to continuously improve the overall performance of the products and obtain the optimization of various performance indicators, the component manufacturers usually optimize each parameter during the manufacturing process of the IGBT, such as changing the lifetime of excess carrier of the IGBT by neutron irradiation, and improving the switching performance through buffering layer technology. IGBTs produced by different manufacturers are similar in structure, and their performance often depends on specific internal process parameters.

At present, there are two methods for extracting the IGBT physical model parameters. One is estimating the parameters by combing the directly measured electrical parameters of three ports of the IGBT with some empirical formulas. The other is indirectly extracting the internal physical parameters of the IGBT through designed circuits. The former has a large error, so that it is difficult to meet the accuracy requirements. The latter has tedious extraction steps and it is affected by the accuracy of extraction circuit, so that the extraction of the parameters is difficult to meet the requirements of the simulation accuracy, and the operability is poor.

SUMMARY

The purpose of the disclosure is to provide an IGBT physical model parameter extraction method aiming at defects in the prior art, so that the IGBT physical model parameter extraction method can be greatly simplified while the requirement of parameter extraction on model simulation precision is ensured, and the practicability of an IGBT physical model is improved.

The disclosure provides an IGBT physical model parameter extraction method, the method comprising: obtaining an initial value and a transformation range of an IGBT physical model parameter; and correcting a model parameter according to the correspondence between IGBT dynamic and static features and the IGBT physical model parameter and in combination with an experiment measurement result of the IGBT physical model parameter.

In a class of this embodiment, the dynamic and static features of the IGBT module under a typical working condition are obtained from a data handbook. A typical value of the relevant parameter of the IGBT physical model is obtained by the theoretical calculations. A reasonable variation range of the typical value of the IGBT physical model parameters is obtained based on the semiconductor physical mechanism.

In a class of this embodiment, the correspondence between the IGBT physical model parameter and the IGBT dynamic and static features is determined by analyzing the influence law and degree of the IGBT physical model parameter and the temperature on the IGBT dynamic and static features.

In a class of this embodiment, in combination with the experiment measurement result of the IGBT physical model parameter, the IGBT physical model parameter is first corrected according to the dynamic and static features that are only affected by a single parameter, and then the IGBT physical model parameter is sequentially corrected starting from a dominant parameters according to the dynamic and static features affected by a coupling of multiple IGBT physical model parameters, and finally a temperature coefficient of the IGBT physical model parameter is corrected according to the variation of the dynamic and static features under different temperatures. At last, a correction result of the IGBT physical model parameter under different temperatures is obtained and the extraction of the model parameter is finished.

In a class of this embodiment, on the basis of the initial value and reasonable range of the IGBT physical model parameters, the model parameter is corrected at a temperature of 25° C. according to the influence trend and degree of the IGBT physical model parameter on IGBT switching transient characteristics. According to an approximate linear relationship between the IGBT transient characteristics and the temperature, a temperature empirical formula inside the model are corrected at a temperature of 125° C., so that the IGBT physical model parameter can accurately represents the IGBT switching transient characteristics within an entire temperature range.

In a class of this embodiment, the method for calculating the initial values and reasonable ranges of the IGBT physical model parameter is as follows:

(1) Base Doping Concentration $N_L$:

$$N_L = 1.932 \times 10^{18} V_B^{-1.4}; \qquad \text{symmetrical structure (1-a)}$$

$$V_B = W_L \left[ \frac{2qN_L(8 \times 10^3 \, N_L^{-0.75})}{\varepsilon_{Si}\varepsilon_0} \right]^{\frac{1}{2}} - \frac{qN_L W_L^2}{2\varepsilon_{Si}\varepsilon_0}. \qquad \text{asymmetrical structure (1-b)}$$

In the above formulas, $V_B$ represents a forward breakdown voltage of a collector-emitter of IGBT, $W_L$ represents a base width, q represents an electron charge constant, $\varepsilon_{si}$ represents a relative permittivity of silicon, and $\varepsilon_0$ represents a permittivity of air.

(2) Base Width $W_L$:

$$W_L = 2.67 \times 10^{10} \cdot N_L^{\frac{7}{8}}. \quad (2)$$

(3) Lifetime of Excess Carrier in Base Region $\tau_L$:

$$\tau_L = \frac{t_{off}}{\ln[10\alpha_{pnp}]}. \quad (3)$$

$$\alpha_{pnp} = \text{sech}\left(\frac{W_L}{L_L}\right). \quad (4)$$

In the above formulas, $\alpha_{pnp}$ represents a common base current amplification factor of parasitic PNP transistor in the IGBT, $t_{off}$ represents a current turn-off time of IGBT, $L_L$ represents a hole diffusion coefficient of the base region.

(4) Trans-Conductance Coefficient $K_p$:

$$K_p = \frac{2 \times I_{MOS}^{sat}}{(V_{GS} - V_{th})^2}; \quad (5)$$

$$I_{MOS}^{sat} = \frac{I_{CE}^{sat}}{1 + \beta_{ss}}; \quad (6)$$

$$\beta_{ss} = \frac{\frac{1}{b}P_0 + Q_1\left(\frac{1}{b} + \frac{1}{\cosh\left(\frac{W(t)}{L_L}\right)}\right)}{P_0 + Q_1\left(1 - \frac{1}{\cosh\left(\frac{W(t)}{L_L}\right)}\right)}. \quad (7)$$

In the above formulas, $P_0$ represents a concentration of the excess carrier of the base region near an edge of a collector PN junction, $Q_1$ represents an equivalent carrier charge of the base region, $I_{MOS}^{sat}$ represents a saturation current of MOSFET, $V_{GS}$ represents a gate-emitter voltage of IGBT, $V_{th}$ represents a threshold voltage of IGBT, $I_{CE}^{sat}$ represents an on-state current of IGBT, $\beta_{ss}$ represents an equivalent current amplification coefficient of IGBT, W(t) represents a quasi-neutral base width, b represents a ratio of electron mobility to hole mobility, and $L_L$ represents a hole diffusion coefficient of the base region; $K_p$ can be obtained by putting $V_{GS}$, $V_{th}$ and $I_{CE}^{sat}$ into the formulas, $I_{CE}^{sat}$ and the corresponding $V_{GS}$ can be obtained from a device data handbook.

(5) Gate Oxide Layer Capacitance $C_{OXD}$:

According to a junction capacitance expression, an initial value of a gate-collector capacitance $C_{GDJ}$ can be estimated firstly, and then an initial value of the gate oxide layer capacitance $C_{OXD}$ can be obtained through a Miller capacitance $C_{GD}$, and the Miller capacitance $C_{GD}$ can be obtained from the data handbook.

(6) Gate-Emitter Capacitance $C_{GS}$:

The gate-emitter capacitance $C_{GS}$ can be approximately equal to the difference between an input capacitance $C_{ies}$ of IGBT and a feedback capacitance $C_{res}$ of IGBT. Therefore, an initial value and the reasonable order of magnitude of the gate-emitter capacitance $C_{GS}$ can be calculated by the following formula (8), wherein the feedback capacitance $C_{res}$ and the input capacitance $C_{ies}$ can be directly obtained from the data handbook.

$$C_{GS} = C_{ies} - C_{res} \quad (8).$$

(7) Other Model Parameters:

An initial value and reasonable correction range of the threshold voltage $V_{th}$ can be obtained from the data handbook. A structure size parameter can be obtained by physical measurement. According to the information disclosed by an IGBT manufacturer, a reference concentration of a buffer layer $N_H$, the lifetime of the excess carrier of the buffer layer $\tau_H$ and a reasonable orders of magnitude of a buffer layer width $W_H$ can be obtained. A lifetime of minority carrier in the buffer layer of IGBT is determined by a doping concentration of the carrier. When a dispersion range of a semiconductor process parameter is put into a calculation formula of an initial value of the parameter, the variation range of the initial value of the model parameter can be obtained, so that the initial value of the model parameter and its reasonable ranges can be determined.

In a class of this embodiment, the model parameters that affect a turn-on delay $t_{don}$ are the gate-emitter capacitance $C_{GS}$, the threshold voltage $V_{th}$ and the Miller capacitance $C_{GS}$. The model parameters that affect a current rise time $t_r$ are the trans-conductance coefficient $K_p$, the threshold voltage $V_{th}$, the gate-emitter capacitance $C_{GS}$ and the base doping concentration $N_L$. The model parameters that affect a turn-off delay taw are the gate-emitter capacitance $C_{GS}$, the threshold voltage $V_{th}$, the trans-conductance coefficient $K_p$ and the gate oxide layer capacitance Coxa. The model parameters that affect a current fall time $t_f$ are the lifetime of excess carrier in the buffer layer $\tau_H$, the lifetime of excess carrier in the base region $\tau_L$, the width of the buffer layer $W_H$, the base width $W_L$ and the base doping concentration $N_L$.

In a class of this embodiment, the IGBT physical model parameter related to the temperature can be calculated by the following temperature empirical formulas.

$$\tau(T_j) = \tau(T_0) \times \left(\frac{T_j}{T_0}\right)^a; \quad (12)$$

$$V_{th}(T_j) = V_{th}(T_0) - b \times (T_j - T_0); \quad (13)$$

$$K_p(T_j) = K_p(T_0) \times \left(\frac{T_j}{T_0}\right)^c; \quad (14)$$

$$I_{sne}(T_j) = \frac{I_{sne}(T_0) \times \left(\frac{T_j}{T_0}\right)^d}{\exp\left[(1/T_j - 1/T_0) \times e \times 10^4\right]}. \quad (15)$$

In the above formulas, a, b, c, d, e are the temperature coefficients related to actual operation characteristics, and they are determined according to an actual device. $\tau(T_0)$, $V_{th}(T_0)$, $K_p(T_0)$ and $I_{sne}(T_0)$ represent the lifetime of excess carrier r, the threshold voltage $V_{th}$, the trans-conductance coefficient and an electron saturation current of the emitter at a temperature of $T_0$, respectively. $\tau(T_j)$, $V_{th}(T_j)$, $K_p(T_j)$ and $I_{sne}(T_j)$ represent the values of the aforementioned physical parameters at a temperature of $T_j$, respectively. Generally, To is equal to 25° C. $T_j$ represents an actual operating junction temperature.

In a class of this embodiment, the IGBT dynamic and static features that are least affected by a coupling of the model parameter are preferentially chosen, and then the IGBT physical model parameter that have a greater impact on the IGBT dynamic and static features is preferentially corrected, so that the IGBT switching transient characteristics represented by the model having the corrected parameter are closer to the value recorded in the data handbook at a temperature of 25° C. The IGBT dynamic and static features that are least affected by a coupling of the temperature-related model parameter are preferentially chosen to correct the temperature coefficient.

In a class of this embodiment, the corrected model parameter is excluded. For the rest IGBT dynamic and static features to be adjusted, the characteristics that have the least coupling relationship with the parameter are chosen to perform the next parameter correction. When the IGBT dynamic and static features meet the requirements within a reasonable range for the first time, the correction of the IGBT physical model parameter is terminated immediately.

In this invention, the initial value of the IGBT physical model parameter and its reasonable correction range is firstly obtained based on the information provided by the data handbook and the typical calculations. Then, the parameter is corrected based on the influence law and degree of each parameter on the IGBT switching transient characteristics. Finally, simulation and experimental verification are conducted on the IGBT physical model based on the corrected parameter. The result shows that the physical model parameter obtained by this method can accurately represent the IGBT switching transient characteristics. Because only the device data handbook and the model calculation are used in this method and a complicated circuit extraction method is not required, this invention significantly reduces the difficulties of the extraction of the IGBT physical model parameter and improves the practicability of the IGBT physical model.

DETAILED DESCRIPTION

Specific embodiments of the invention are further described in details combining with the drawings hereinbelow.

This invention provides an IGBT physical model parameter extraction method, characterized by comprising the following steps of: obtaining an initial value and a transformation range of an IGBT physical model parameter; and correcting a model parameter according to the correspondence between IGBT dynamic and static features and the IGBT physical model parameter and in combination with an experiment measurement result of the IGBT physical model parameter. The method specially comprises the following steps.

Figure 1:
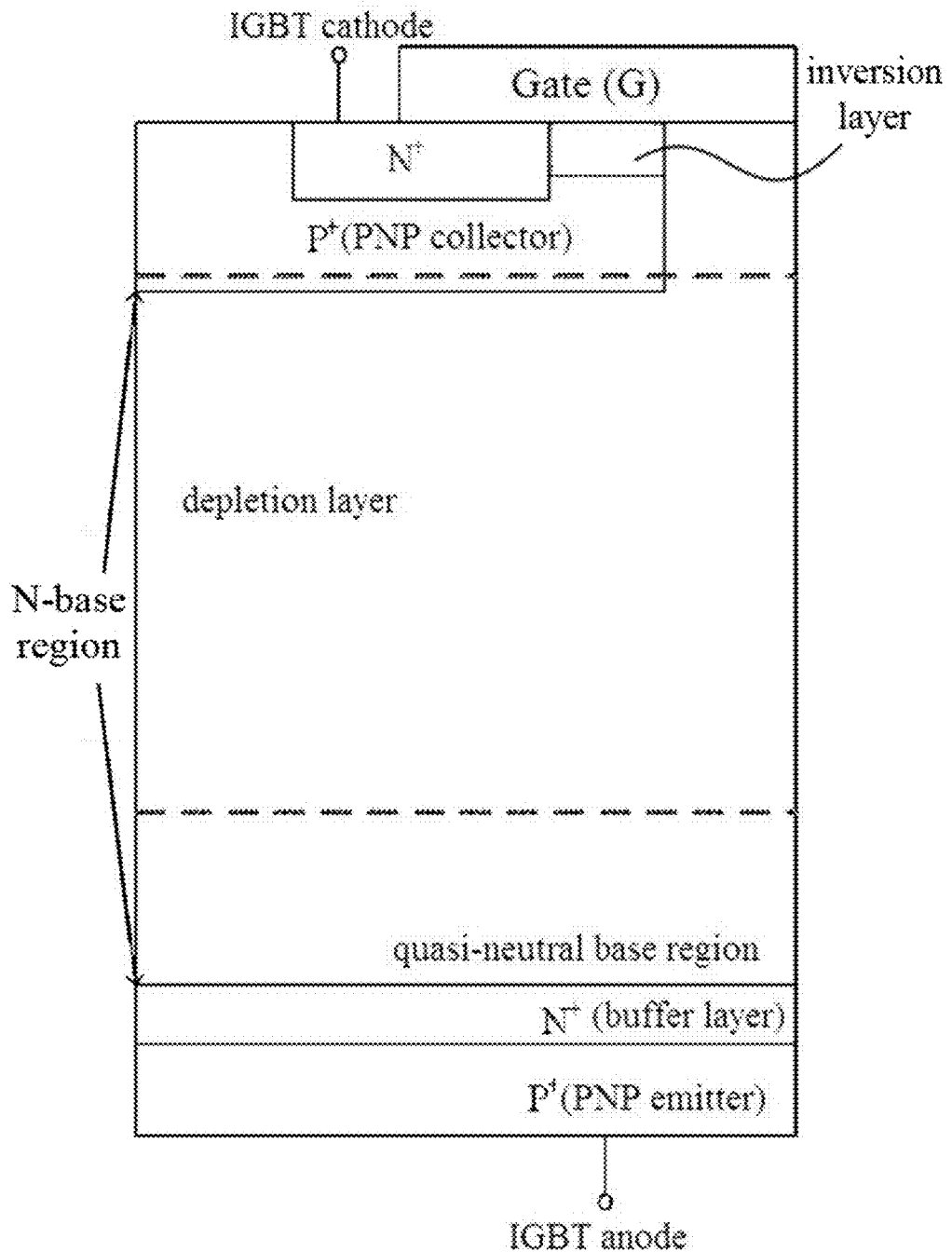
FIG. 1 is a structure diagram of an IGBT with a buffer layer.

1. Determination of the Initial Value and Reasonable Range of the IGBT Physical Model Parameter FIG. 1 shows a typical structure diagram of the IGBT. The physical model parameter mainly includes the parameter directly related to the semiconductor process, such as $V_{th}$, $C_{GS}$, $C_{OXD}$, $K_p$, $N_L$, $W_L$, $W_H$, $\tau_L$, $\tau_H$. In the process of model parameter correction, if the value of the parameter exceeds the reasonable range, the model will lose its physical meaning. Therefore, the initial value of the parameter and its reasonable correction range should be determined firstly before the parameter correction. The specific calculation method is as follows.

(1) Base Doping Concentration $N_L$

According to the semiconductor theory, a depletion layer mainly extends in N-base region during forward blocking, and the base doping concentration plays a key role in the forward blocking performance of the IGBT. Therefore, the initial value of $N_L$ and its reasonable order of magnitude can be estimated according to the formula (1), wherein $V_B$ represents the breakdown voltage:

$$N_L = 1.932 \times 10^{18} V_B^{-1.4}; \qquad \text{Symmetrical structure(1-a)}$$

$$V_B = W_L \left[ \frac{2qN_L(8 \times 10^3 N_L^{-0.75})}{\varepsilon_{Si}\varepsilon_0} \right]^{\frac{1}{2}} - \frac{qN_L W_L^2}{2\varepsilon_{Si}\varepsilon_0}. \qquad \text{Asymmetrical structure (1-b)}$$

(2) Base Width $W_L$

Since the breakdown voltage is closely related to the base doping concentration and the base width, and the size of the base width depends on the base doping concentration, the initial value of $W_L$ can be calculated by the formula (2) and the formula (1):

$$W_L = 2.67 \times 10^{10} \cdot N_L^{-\frac{7}{8}}. \qquad (2)$$

(3) Lifetime of Excess Carrier in Base Region $\tau_L$

The order of magnitude of the lifetime of the excess carrier in the base region can be estimated by $t_{off}$ and semiconductor theory formulas. $t_{off}$ can be obtained from the device handbook.

$$[\tau_L = \frac{t_{off}}{\ln[10\alpha_{pnp}]}; \qquad (3)$$

$$\alpha_{pnp} = \text{sech}\left(\frac{W_L}{L_{Lp}}\right). \qquad (4)$$

In the above formulas, $\alpha_{pnp}$ represents the common base current amplification factor of parasitic PNP transistor in the IGBT, $t_{off}$ represents the current turn-off time of IGBT, $L_{Lp}$ represents the hole diffusion coefficient of the base region.

(4) Trans-Conductance Coefficient $K_p$

The initial value of $K_p$ can be calculated by combining the following equations:

$$K_p = \frac{2 \times I_{MOS}^{sat}}{(V_{GS} - V_{th})^2}; \quad (5)$$

$$I_{MOS}^{sat} = \frac{I_{CE}^{sat}}{1 + \beta_{ss}}; \quad (6)$$

$$\beta_{ss} = \frac{\frac{1}{b}P_0 + Q_1\left(\frac{1}{b} + \frac{1}{\cosh\left(\frac{W(t)}{L_L}\right)}\right)}{P_0 + Q_1\left(1 - \frac{1}{\cosh\left(\frac{W(t)}{L_L}\right)}\right)}. \quad (7)$$

In the above formulas, $P_0$ represents the concentration of the excess carrier of the base region near the edge of the collector PN junction, $Q_1$ represents the equivalent carrier charge of the base region, $I_{MOS}^{sat}$ represents the saturation current of MOSFET. $K_p$ can be obtained by putting $V_{GS}$, $V_{th}$ and $I_{CE}^{sat}$ into the formulas. $I_{CE}^{sat}$ and the corresponding $V_{GS}$ can be obtained from the device data handbook.

(5) $C_{OXD}$

According to the junction capacitance expression, the initial value of the gate-collector capacitance $C_{GDJ}$ can be estimated firstly, and then the initial value of the gate oxide layer capacitance $C_{OXD}$ can be obtained through the Miller capacitance $C_{GD}$. The Miller capacitance $C_{GD}$ can be obtained from the data handbook.

(6) $C_{GS}$

The gate-emitter capacitance $C_{GS}$ can be approximately equal to the difference between an input capacitance $C_{ies}$ of IGBT and the feedback capacitance $C_{res}$ of IGBT. Therefore, the initial value and the reasonable order of magnitude of the gate-emitter capacitance $C_{GS}$ can be calculated by the formula (8), wherein $C_{res}$ and $C_{ies}$ can be directly obtained from the data handbook.

$$C_{GS} = C_{ies} - C_{res} \quad (8)$$

(7) Other Model Parameters

The initial value and reasonable correction range of the threshold voltage $V_{th}$ can be obtained from the data handbook. The structure size parameter can be obtained by physical measurement.

According to the information disclosed by the IGBT manufacturer, the reasonable order of magnitude of $N_H$, $\tau_H$ and $W_H$ can be obtained. According to the semiconductor theory, the lifetime of minority carrier in the buffer layer of the IGBT is determined by the doping concentration of the carriers. When the dispersion range of the semiconductor process parameter are put into the calculation formulas of the initial value of the parameter, the variation range of the initial value of the model parameter can be obtained, so that initial value of the model parameter and its reasonable range can be determined.

Figure 2:
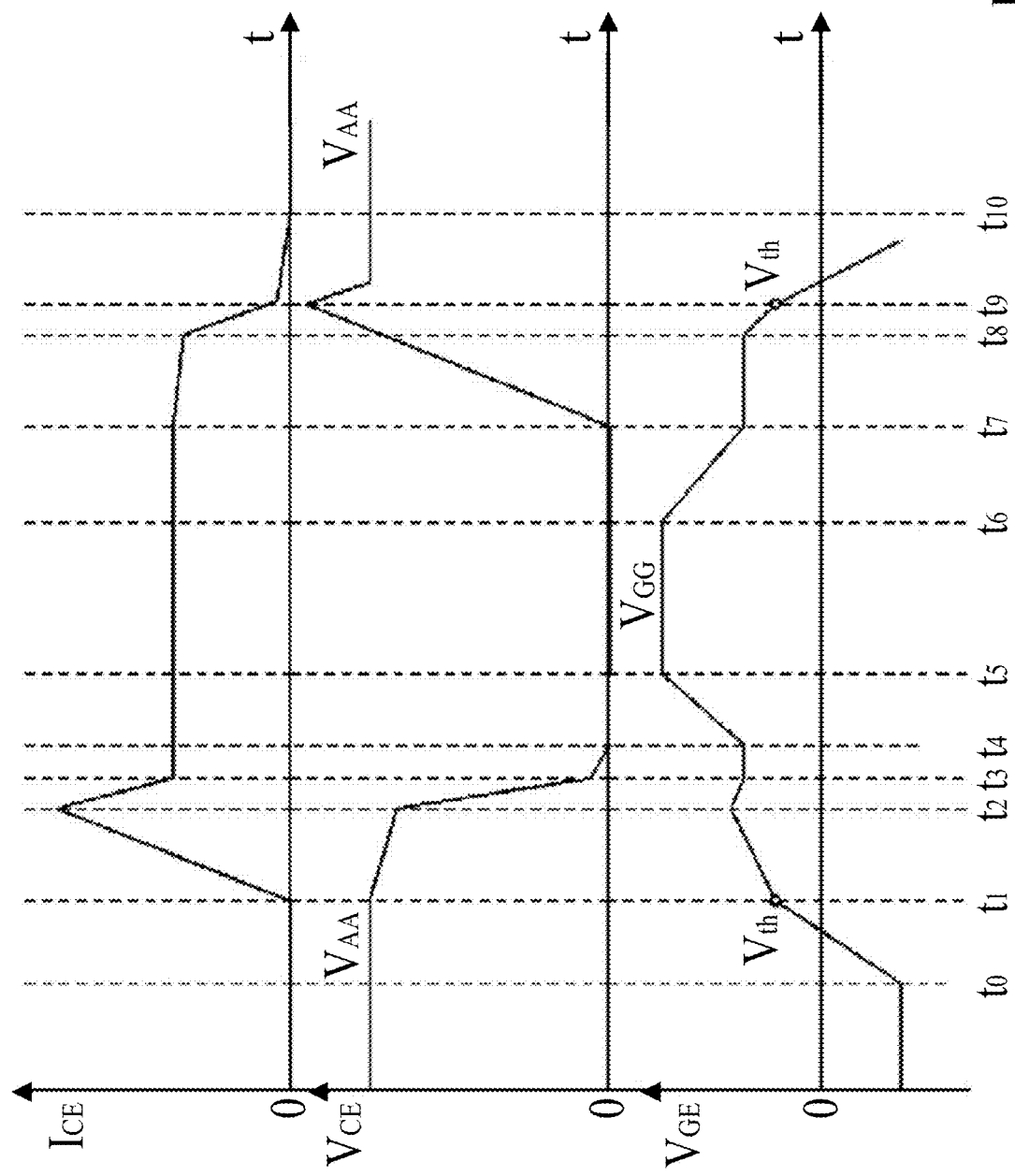
FIG. 2 is a waveform diagram of the IGBT during a switching process.
Figure 3:
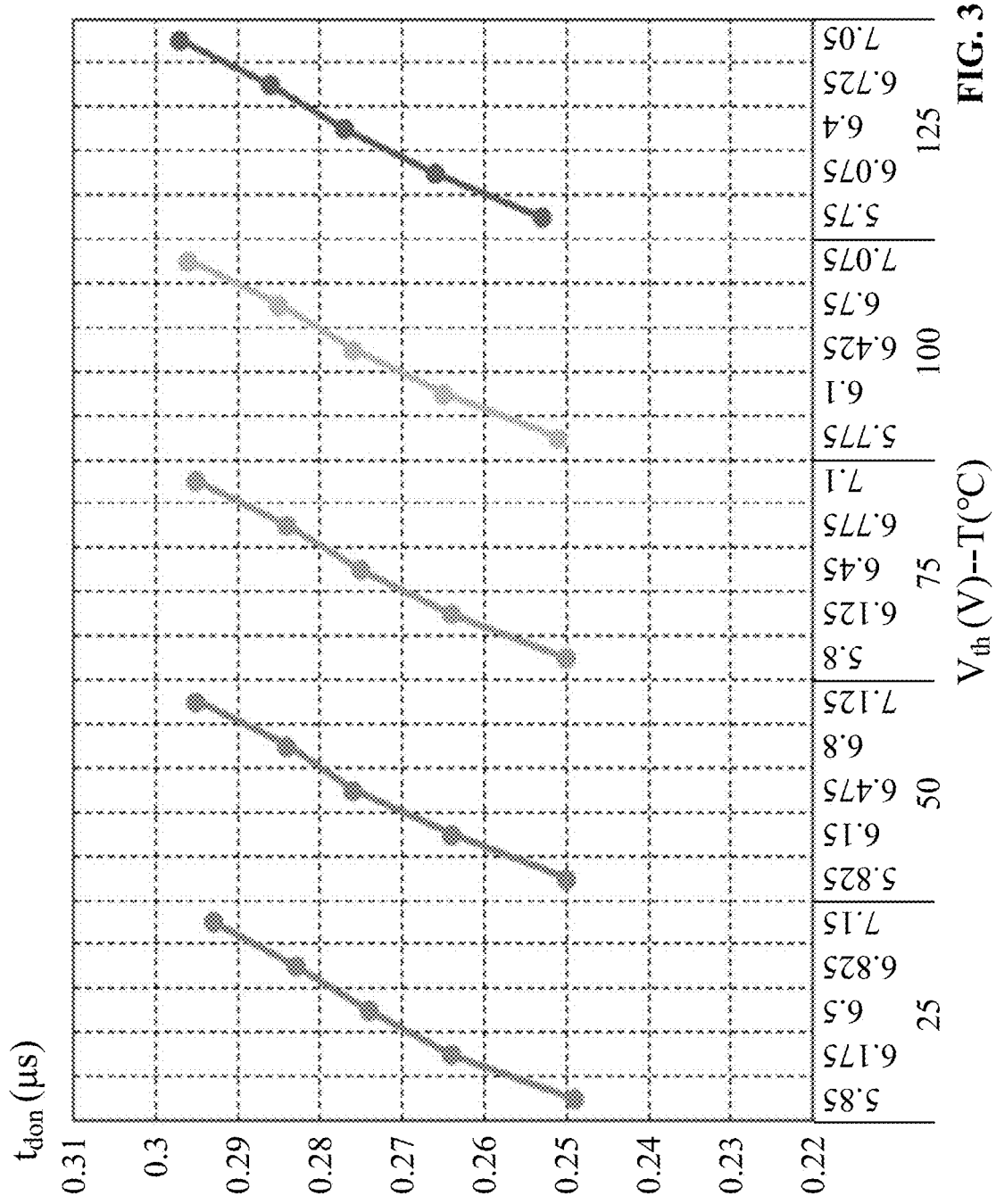
FIG. 3 shows a variation rule of $t_{don}$ with $V_{th}$ under different temperatures.
Figure 4:
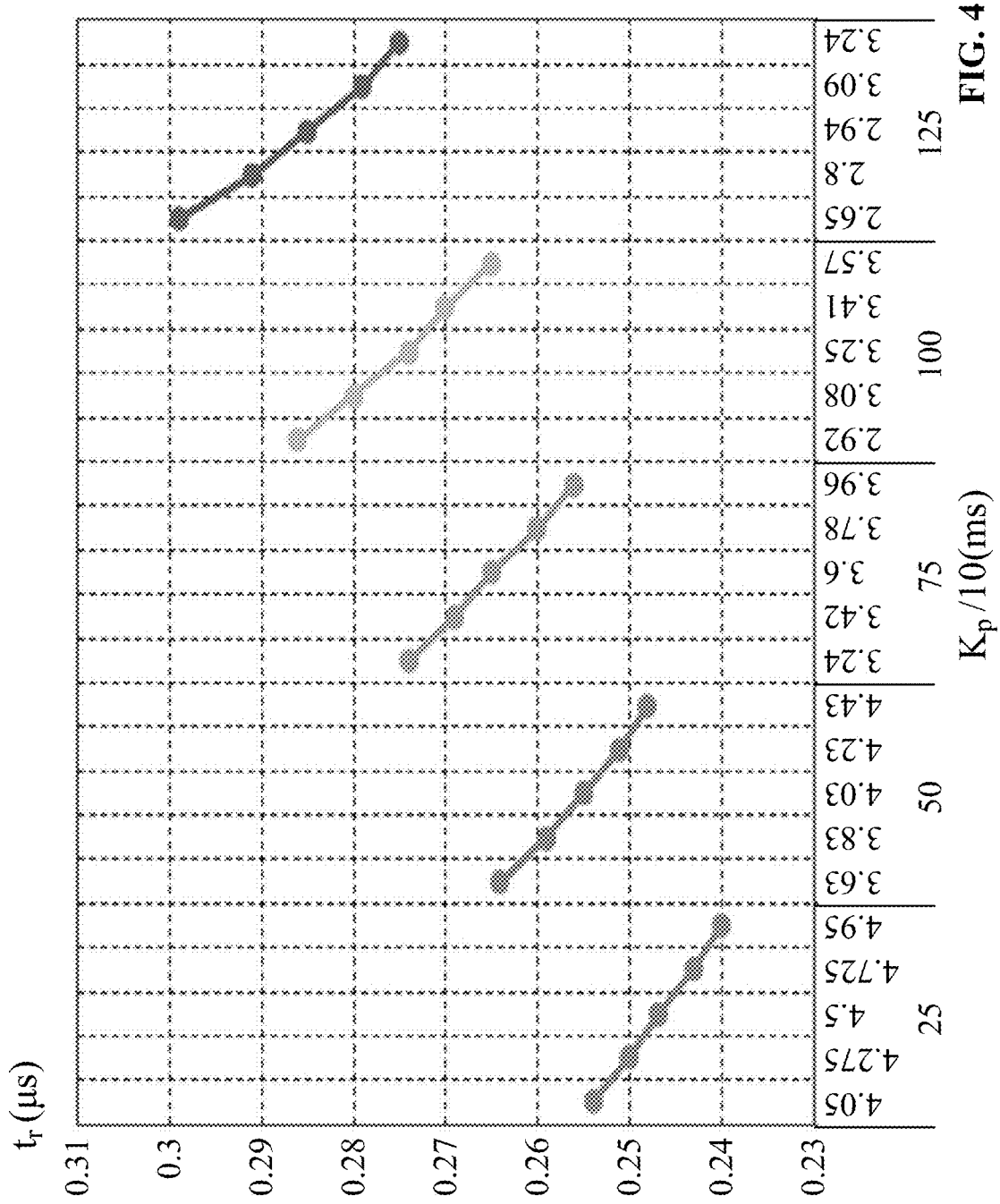
FIG. 4 shows a variation rule of $t_r$ with $K_p$ under different temperatures.
Figure 5:
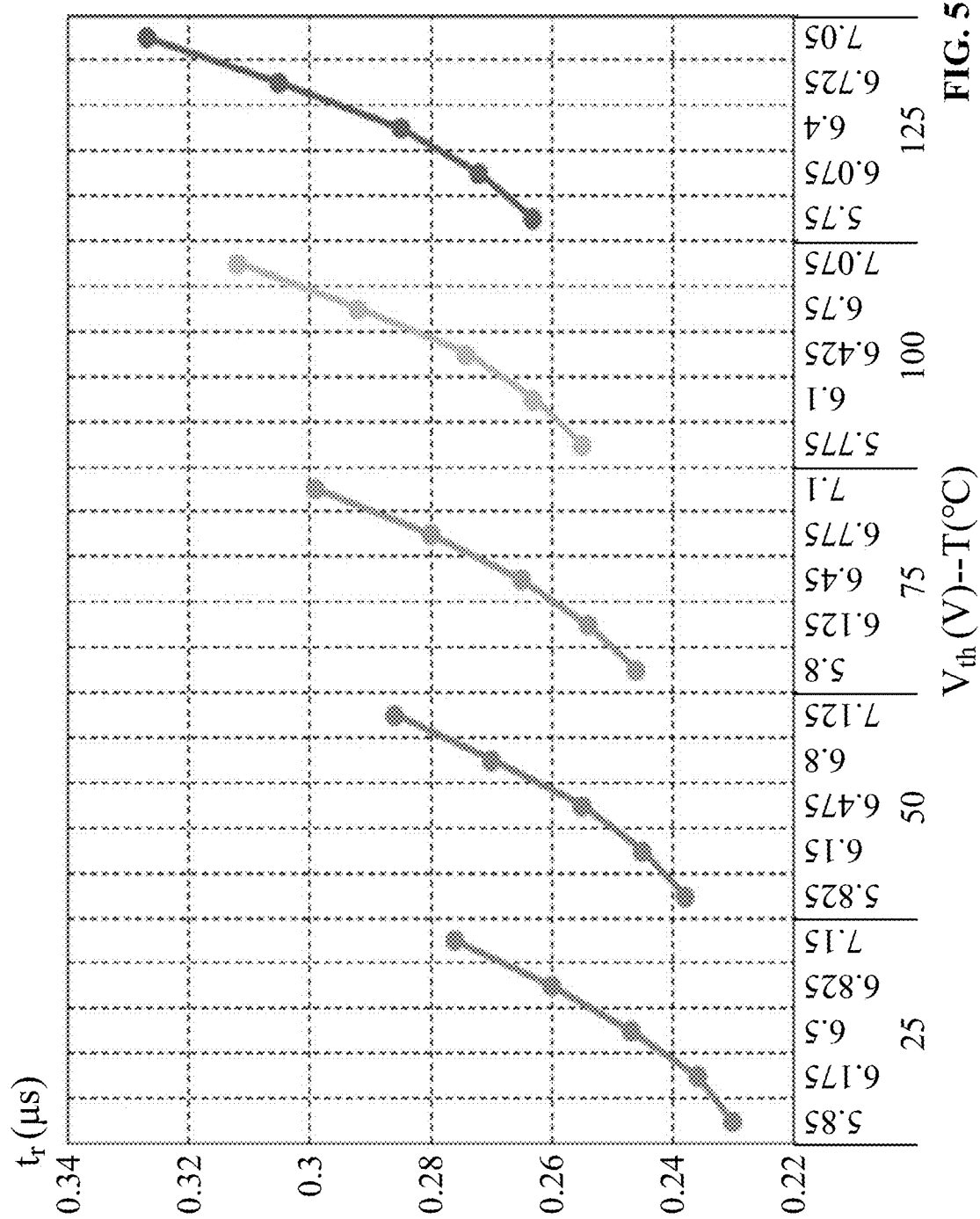
FIG. 5 shows a variation rule of $t_r$ with $V_{th}$ under different temperatures.
Figure 6:
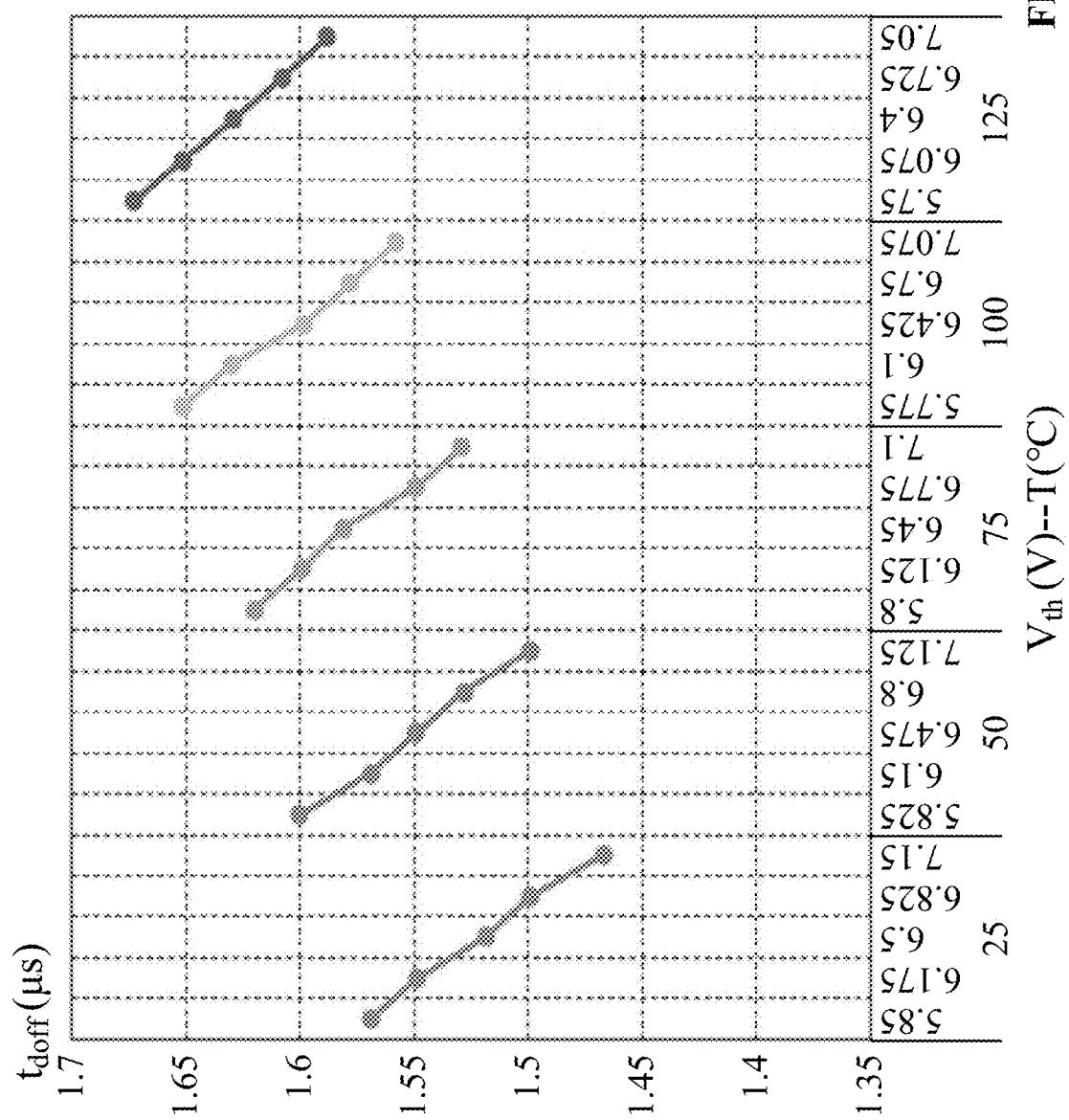
FIG. 6 shows a variation rule of $t_{doff}$ with $V_{th}$ under different temperatures.
Figure 7:
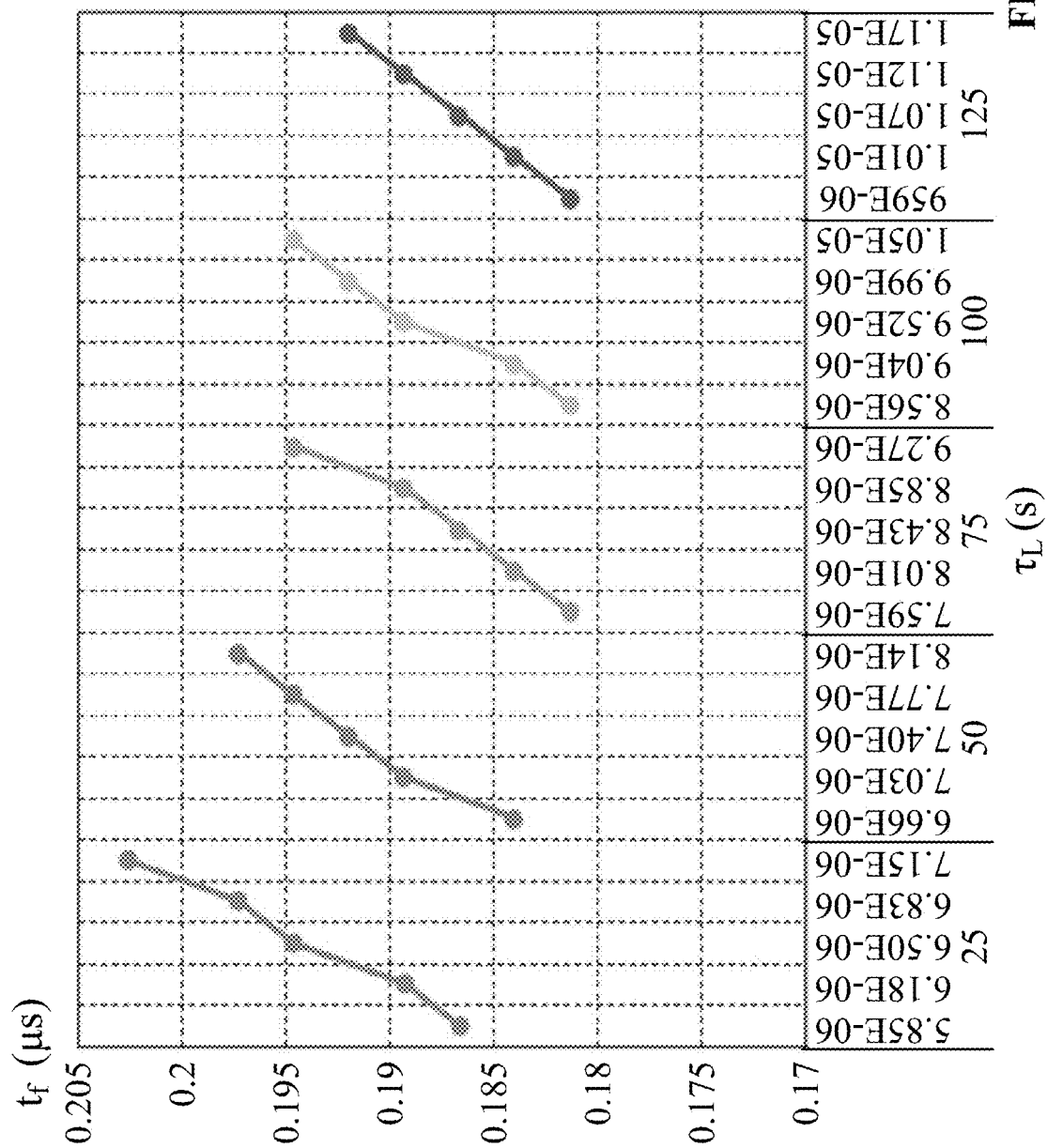
FIG. 7 shows a variation rule of $t_f$ with $\tau_L$ under different temperatures.
Figure 8:
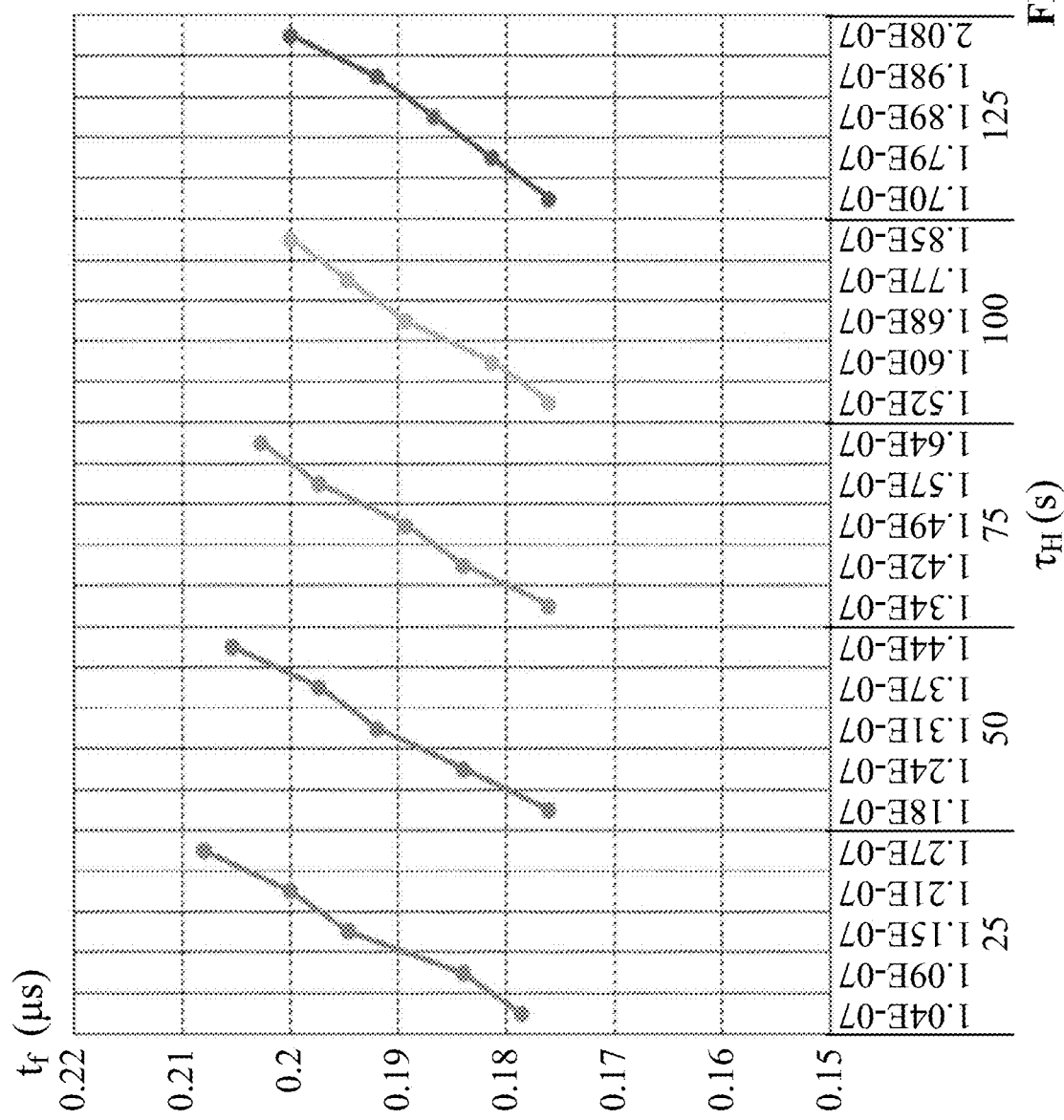
FIG. 8 shows a variation rule of $t_f$ with $\tau_H$ under different temperatures.
Figure 9:
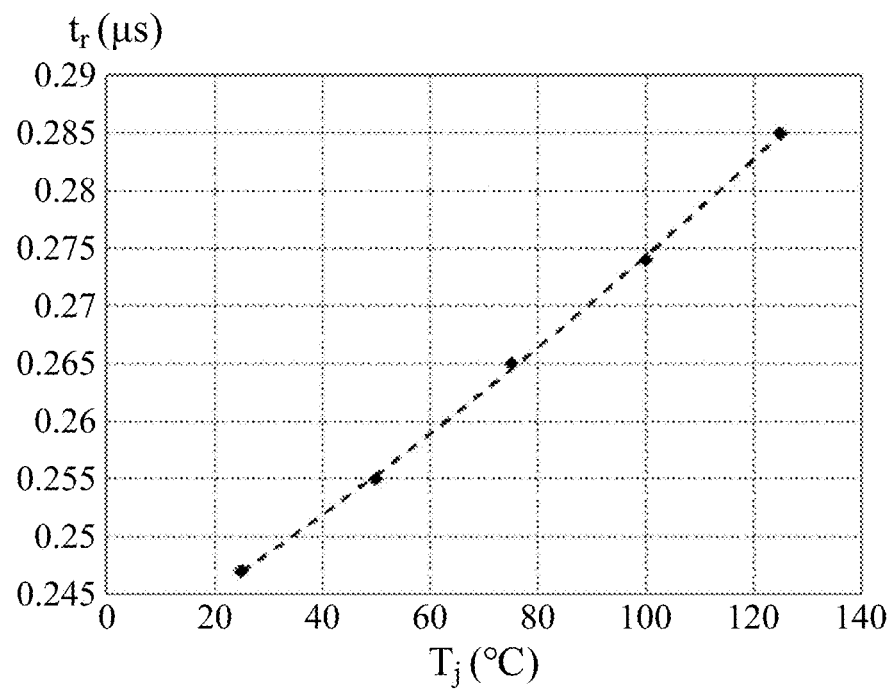
FIG. 9 shows a variation rule of $t_r$ with $T_j$.
Figure 10:
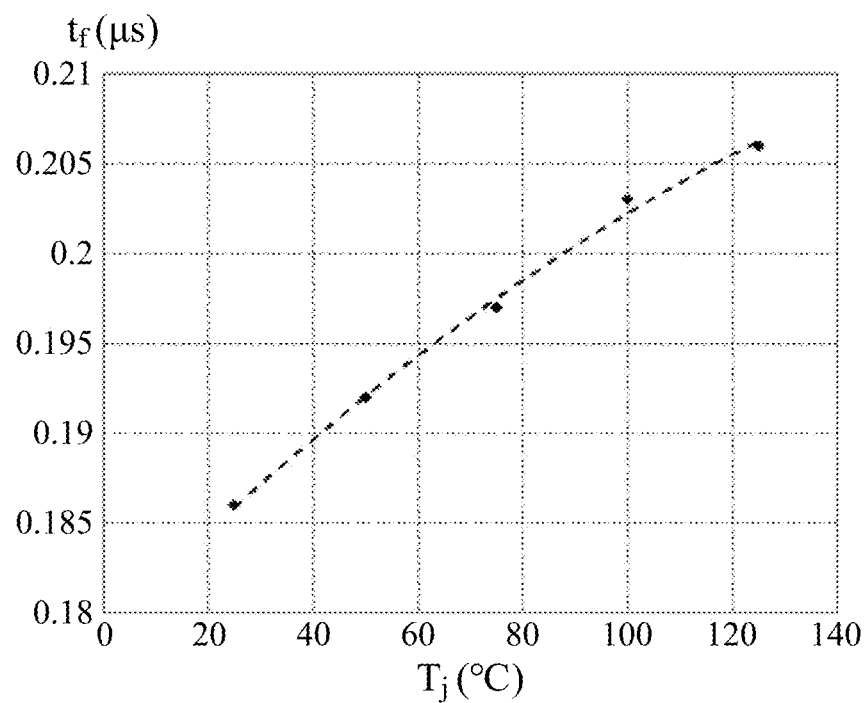
FIG. 10 shows a variation rule of $t_f$ with $T_j$.
Figure 11:
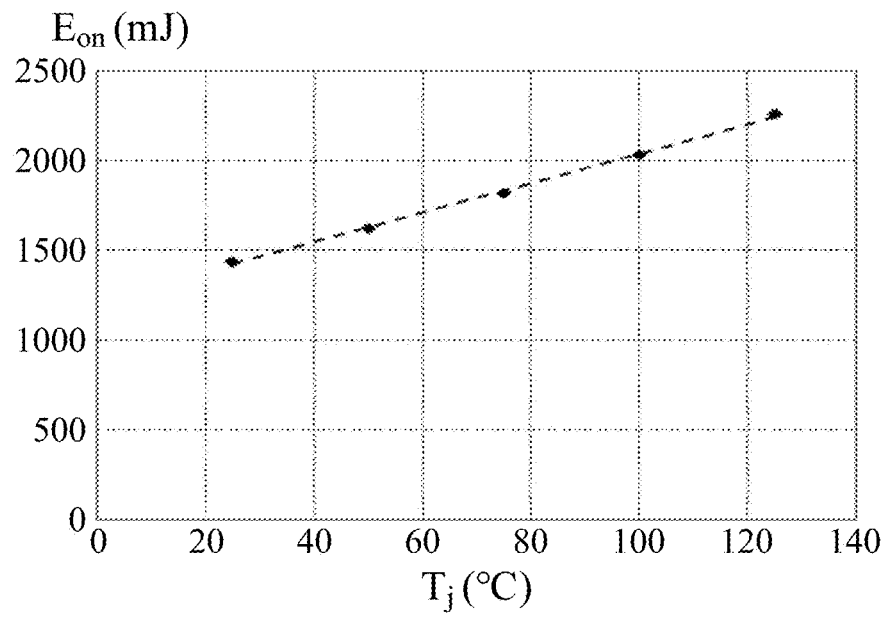
FIG. 11 shows a variation rule of $E_{on}$ with $T_j$.
Figure 12:
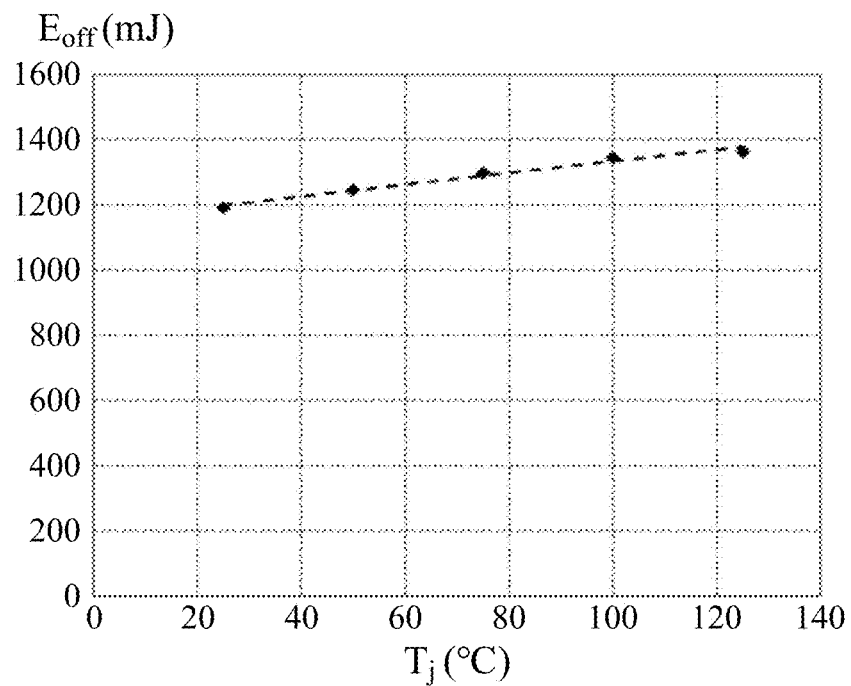
FIG. 12 shows a variation rule of $E_{off}$ with $T_j$.

2. Analysis of the Influence Law and Degree of the IGBT Physical Model Parameter on the Characteristics of the IGBT 2.1 Analysis of the Influence Law and Degree of the Model Parameter on the Turn-on Characteristics of the IGBT Under a Constant Temperature As shown in FIG. 2, the turn-on time of the IGBT can be divided into two parts, namely a turn-on delay time $t_{don}$ and a turn-on rise time $t_r$. On basis of the established physical model, a simulation is conducted on the influence of each parameter on $t_{don}$ and $t_r$ within the reasonable ranges of typical parameter values, wherein the model parameters are used as variables. In the phase of turn-on delay, a drive circuit charges the $C_{GS}$, and $V_{GE}(t)$ gradually increases from lower than $V_{th}$ to higher than $V_{th}$. When $V_{GE}(t) = V_{th}$, the IGBT is turned on and $I_{CE}$ gradually increases from zero. Therefore, $\tau_{don}$ is related to $C_{GS}$, $V_{th}$ and $C_{GS}$.

The variation of the rising rate of $I_{CE}$ will directly affect $t_r$. $I_{CE}$ includes MOSFET channel current $I_{mos}$, IGBT collector-emitter hole current $I_P$ and charge-discharge current of internal junction capacitance $I_c$.

$$I_{CE} = I_{mos} + I_P + I_c \quad (9)$$

In accordance with the principle of MOSFET, the variations of $K_p$, $V_{th}$ and $C_{GS}$ will have an impact on $I_{mos}$. As known from the expression (10) of the hole current of the physical model, the model parameters related to $I_P$ are $N_L$, $\tau_L$, $W_H$ and $W_L$.

$$I_P = \frac{\left(1 + B_b \cdot \frac{3W_H^2}{2D_{pH}\tau_L}\right)\frac{I_{CE}}{1+b} + B_b Q_T\left(\frac{6D_L}{W^2(t)} + \frac{C_{BCJ}\frac{dV_{AA}}{dt}}{qAW(t)N_L} - \frac{1}{\tau_L}\right)}{1 + B_b\left(\frac{3D_L}{W^2(t)D_{pH}} + \frac{W_H^2 C_{BCJ}\frac{dV_{AA}}{dt}}{2qAW(t)D_{pH}N_L} + \frac{W_H^2}{D_{pH}\tau_L}\right)} \quad (10)$$

In the above formula, $B_b$, $Q_T$, $W_H$, $D_p H$ and $C_{BCJ}$ are the semiconductor parameters related to the physical model.

Therefore, the model parameters that affect $t_r$ are $K_p$, $V_{th}$, $C_{GS}$ and $N_L$.

2.2 Analysis of the Influence Law and Degree of the Model Parameter on the Turn-Off Characteristics of the IGBT Under a Constant Temperature As shown in FIG. 2, the turn-off time of the IGBT can be divided into two parts, namely a turn-off delay time taw and a turn-off fall time $t_f$. It can be known from the analysis of the waveform of the turn-off delay phase that $V_{GE}(t)$ gradually decreases from $V_{GG}$ to $V_{GP}$ with the discharge of $C_{GS}$. $V_{GP}$ is only related to $V_{th}$ and $K_p$.

$$V_{GP} = V_{th} + \sqrt{\frac{(I_P + I_n)}{K_p}} \quad (11)$$

In the phase of [t6-t7], $V_{GE}(t)$ is in a Miller plateau. Therefore, $C_{GS}$, $V_{th}$, $K_p$ and $C_{OXD}$ will have an impact on $t_{doff}$.

The turn-off fall phase of the IGBT can be divided into two parts. a) When $V_{GE}(t)$ drops slightly less than $V_{th}$, the conductive channel in the MOSFET disappears and the channel current rapidly drops to zero. b) Although the electron current disappears rapidly, a large number of excess carriers are still left inside the IGBT. The excess carriers will gradually disappear through recombination, which will result in a "tailing" of the turn-off current. As the phase a) is finished in an instant, the effect of this period on $t_f$ is negligible. The slower recombination process of the excess carrier becomes the main factor that affects $t_f$. According to the semiconductor theory, the greater the carrier recombination rate, the stronger the recombination effect and the smaller $t_f$. The recombination rate is related to the lifetime and the concentration of the excess carriers. Therefore, the model parameters related to $t_f$ are $\tau_H$, $\tau_L$, $W_H$, $W_L$, $N_L$.

The simulation result of the influence law and degree of the model parameter on the IGBT transient characteristics are shown in FIGS. 3-8 and Table 1.

TABLE 1

The influence law and degree of the IGBT physical model parameter on the characteristics under switching transient (The direction of the arrow indicates the law of influence, and the number of arrows indicates the degree of the influence)

| | $t_{don}$/μs | $t_r$/μs | $t_{doff}$/μs | $t_f$/μs | $E_{on}$/mJ | $E_{off}$/mJ |
|---|---|---|---|---|---|---|
| $V_{th}$/V↑ | ↑↑ | ↑↑↑↑ | ↓↓↓ | — | ↑↑↑↑ | — |
| $C_{GS}$/F↑ | ↑ | ↑ | ↑ | — | ↑ | — |
| $C_{OXD}$/F↑ | — | — | ↑↑↑↑ | — | — | — |
| $K_p$/A/V²↑ | — | ↓↓↓ | ↑↑ | — | ↓↓↓ | — |
| $N_L$/cm⁻³↑ | — | ↑↑ | — | ↓↓↓↓ | ↑↑ | ↓↓ |
| $W_L$/cm↑ | — | — | — | ↓↓↓↓↓ | — | ↓↓↓↓↓ |
| $W_H$/cm↑ | — | — | — | ↓↓↓ | — | ↓↓↓↓ |
| $τ_L$/s↑ | — | — | — | ↑ | — | ↑ |
| $τ_H$/s↑ | — | — | — | ↑↑ | — | ↑↑↑ |

2.3 Analysis of the Influence Law and Degree of the Temperature on the Characteristics of the IGBT The parameters of the components related to the temperature can be calculated by the following temperature empirical formulas.

$$\tau(T_j) = \tau(T_0) \times \left(\frac{T_j}{T_0}\right)^a; \quad (12)$$

$$V_{th}(T_j) = V_{th}(T_0) - b \times (T_j - T_0); \quad (13)$$

$$K_p(T_j) = K_p(T_0) \times \left(\frac{T_j}{T_0}\right)^c; \quad (14)$$

$$I_{sne}(T_j) = \frac{I_{sne}(T_0) \times \left(\frac{T_j}{T_0}\right)^d}{\exp\left[(1/T_j - 1/T_0) \times e \times 10^4\right]}. \quad (15)$$

In the above formula, the temperature coefficients a, b, c, d, e are positive, and they are related to the actual operation characteristics. $\tau(T_0)$, $V_{th}(T_0)$, $K_p(T_0)$ and $I_{sne}(T_0)$ represent the lifetime of the excess carrier, the threshold voltage, the trans-conductance coefficient and the electron saturation current of the emitter at a temperature of $T_0$, respectively. $\tau(T_j)$, $V_{th}(T_j)$, $K_p(T_j)$ and $I_{sne}(T_j)$ represent the values of the aforementioned physical parameters at a temperature of $T_j$, respectively. Generally, $T_0$ is equal to 25° C. $T_j$ represents an operating junction temperature. The influence of the operating junction temperature of the IGBT on the switching transient characteristics of the IGBT can be obtained by combing the relationship between these parameters related to temperature and the variation of the temperature as well as the relationship between the parameters and the IGBT switching transient characteristics. The simulation result is shown in FIGS. 9-12.

3. The Correction Method of the IGBT Physical Model Parameter

Based on the initial value and the reasonable range of the parameter, the model parameter is corrected at a temperature of 25° C. according to the influence trend and degree of the parameter on the IGBT transient characteristics. According to an approximate linear relationship between the IGBT transient characteristics and the temperature, the temperature empirical formula inside the model will be corrected at a temperature of 125° C., so that the IGBT physical model parameters can accurately represent the IGBT switching transient characteristics within an entire temperature range.

(1) Correction of the Model Parameter at a Temperature of 25° C.

Considering the wide variety of the model parameters and their complex coupling effects on the IGBT switching transient characteristics, according to the influence trend and degree of the model parameter on the IGBT transient characteristics, the IGBT characteristics that are least affected by the coupling of the model parameter is preferentially chosen, and then the preferentially corrected parameter is chosen according to the influence degree of the parameter on the characteristics, so that the IGBT switching transient characteristics represented by the model having the corrected parameters are closer to the values recorded in the data handbook at a temperature of 25° C. The correction process is as follows:

i) $t_{don}$

As shown in Table 1, in the IGBT switching transient characteristics, the least parameters related to $t_{don}$ is $V_{th}$ and $C_{GS}$, and $C_{GS}$ has a greater impact on $t_{don}$. Therefore, $C_{GS}$ is preferred chosen and $C_{GS}$ will be corrected according to the influence rule of $C_{GS}$ on $t_{don}$ that shown in the Table 1. When $t_{don}$ meets the requirements for the first time, the correction to $C_{GS}$ is immediately terminated. Otherwise, $V_{th}$ can be further corrected. The method of the correction is the same as that of $C_{GS}$.

ii) $t_r$

The corrected model parameters are excluded. For the rest IGBT dynamic and static characteristics to be adjusted, the characteristics that have the least coupling relationship with the parameters are chosen to perform the next parameter correction. As shown in the Table 1, only $K_p$ and $N_L$ are left. Considering the requirements on the forward blocking of the IGBT, a large adjustment to $N_L$ should be avoided during the correction, so that $K_p$ is preferred for correction. According to the variation rule of $t_r$ with $K_p$, when $t_r$ meets the requirements for the first time, the correction of $K_p$ can be terminated. Otherwise, a fine-tuning is performed on $N_L$ to make $t_r$ meet the requirements, and then the correction of $N_L$ can be terminated.

iii) $E_{on}$

So far, the debugging of the transient characteristics related to the turn-on time of the IGBT has been finished. If the turn-on time of the IGBT meets the requirements, $E_{on}$ will also meet the requirements at the same time.

iv) $t_{doff}$

Except for the above corrected parameters, among the remaining characteristics to be adjusted, the only parameter that affects $t_{doff}$ is $C_{OXD}$. Thus, the $C_{OXD}$ is corrected based on the rules shown in the table to make $t_{doff}$ meet the requirements for the first time. Then, the correction can be terminated.

v) $t_f$ and $E_{off}$

The other modifiable parameters have a coupling effect on $E_{off}$ and $t_f$ at the same time. However, since $E_{off}$ is not only related to $t_f$ but also closely related to the turn-off tail current, $t_f$ is preferred for debugging. $W_H$ and $τ_H$ have a greater impact on the tail current, so that $W_L$ and $τ_L$ are preferred for correction when debugging $t_f$.

According to the variation rule of $t_f$ with $W_L$, $W_L$ is corrected. When $t_f$ meets the requirements for the first time, the correction to $W_L$ can be terminated. Otherwise, $τ_L$ is corrected until $t_f$ meets the requirements. At the same time, if $E_{off}$ also meets the requirements, the parameter correction is finished. Otherwise, $τ_H$ is corrected. When hand $E_{off}$ meet the requirements at the same time, the correction is terminated and the correction of the model parameters at a temperature of 25° C. is finished.

(2) Correction of the Model Parameters at a Temperature of 125° C.

Similar to the correction process under a temperature of 25° C., the IGBT characteristics that are least affected by the coupling of the model parameters related to the temperature are preferentially chosen, and the temperature coefficients are corrected. The analysis of the correction process is as follows.

i) $t_{don}$

It is preferred to choose the temperature coefficient a that corrects $V_{th}$. When $t_{don}$ meets the requirements for the first time, the correction to the temperature coefficient a will be terminated.

ii) $t_r$

The temperature coefficient b of the characteristic $t_r$-$K_p$ that is least affected by the coupling of the temperature-related parameters is chosen to be corrected. When $t_r$ meets the requirements for the first time, the correction to b can be terminated.

iii) $t_{doff}$

Since the hole saturation drift velocity $v_{sat,p}$ decreases with the increase of the temperature, taw increases with the increase of the temperature. Therefore, $t_{doff}$ can be adjusted by correcting the temperature coefficient of $v_{sat,p}$.

iv) $t_f$ and $E_{off}$

According to the requirements of $t_f$ and $E_{off}$, the temperature coefficients of $\tau_L$ and $\tau_H$ are corrected at the same time so as to complete the correction of the temperature coefficient at a temperature of 125° C.

4. Extraction Method of the IGBT Physical Model Parameter

Figure 14:
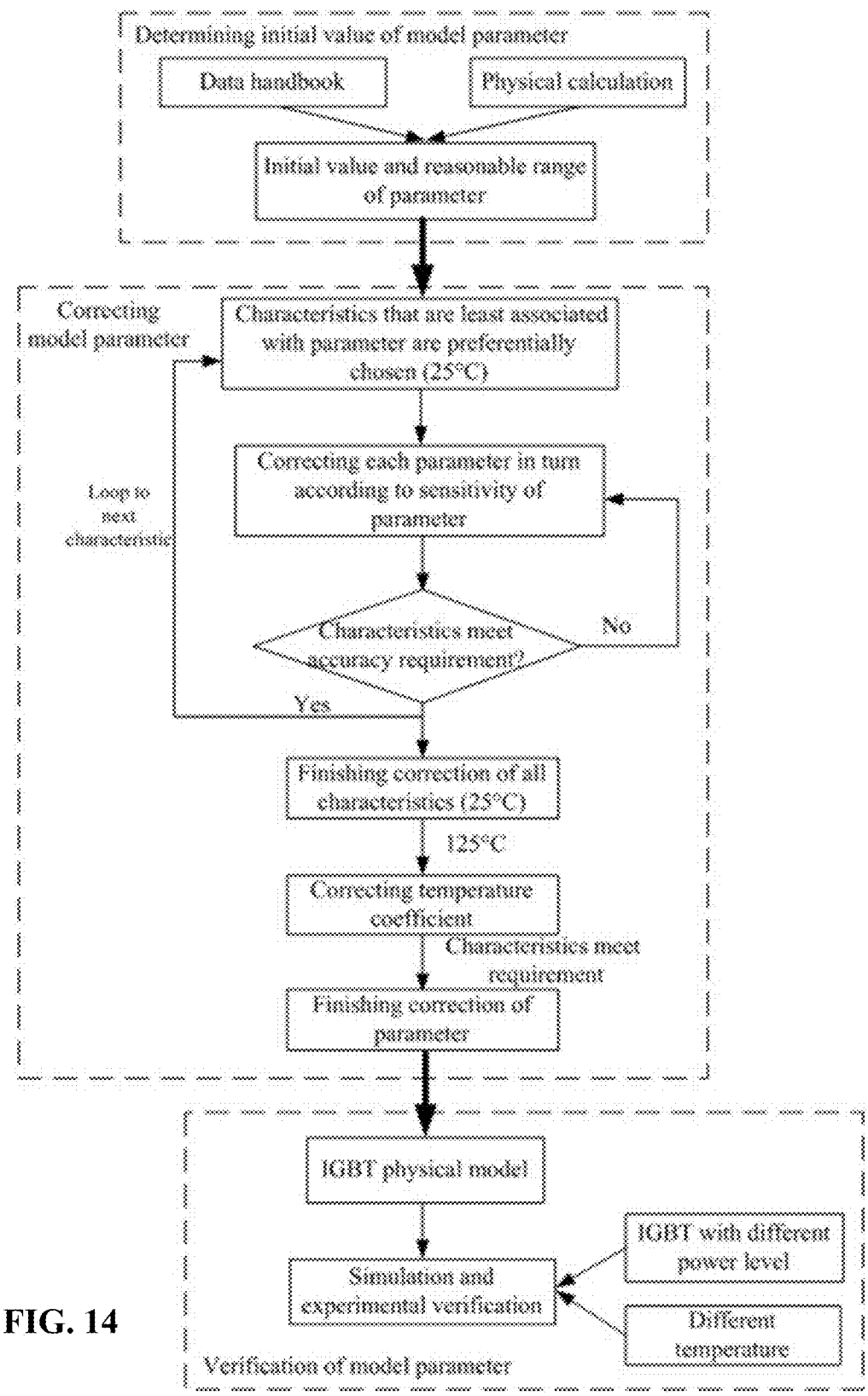
FIG. 14 is a flow diagram of an IGBT physical model parameter extraction method.

Based on the above analysis method and conclusion, the IGBT physical model parameters extraction method is as follows. The dynamic and static characteristics of the IGBT module under a typical working condition are obtained from the data handbook. The typical values of the physical model parameters are obtained through theoretical calculations. Then, the reasonable variation ranges of the typical values of the model parameters are obtained based on the semiconductor physical mechanism. Next, the correspondence between the model parameters and the IGBT dynamic and static characteristics is determined by analyzing the influence law and degree of the model parameters and the temperature on the IGBT dynamic and static characteristics. Further, based on the actual test result, the parameter is corrected in term of the characteristic that only affected by a single parameter firstly. Then, in term of the characteristics affected by the multi-parameter coupling, the dominant parameters are corrected in turn. At last, the temperature coefficient of the parameter is corrected by combining the characteristic variations under different temperatures. Finally, the correction results of the model parameters under different temperatures are obtained, and the extraction of the model parameters is realized. The flow chart of the extraction method is shown in FIG. 14.

5. Experimental Verification

Figure 13:
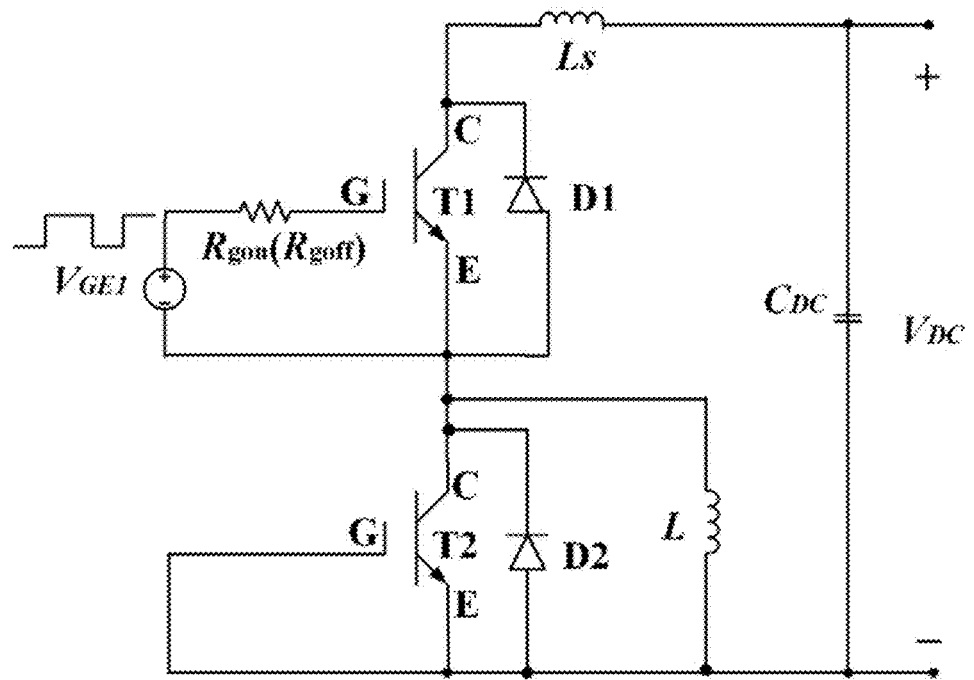
FIG. 13 shows an IGBT double pulse simulation test circuit.

The simulation and the experimental verification are performed on Infineon 3300V/1500 A IGBT module. Firstly, based on the established physical model, an IGBT double pulse test simulation is performed on the improved model according to the initial value and the corrected value of the model parameters. The simulation and the test circuit are shown in FIG. 13, wherein L=90 uH, $R_{gon}$=0.9Ω, $R_{goff}$=2.7Ω, $I_{CE}$=1500 A, $V_{DC}$=1800V, $L_S$=40 nH, $C_{GE}$=330 nF.

Table 2 shows the values of the model parameters extracted by the method of this invention. Table 3 shows the comparison between the double-pulse simulation result of the IGBT module using the initial values of the model parameters and the double-pulse simulation result of the IGBT module using the extraction values of the present invention. It can be seen that the simulation result of this invention are in good agreement with the actual measurement result, which verifies the correctness of the IGBT physical model parameter extraction method of this invention.

TABLE 2

The initial values and extraction values of the parameters of Infineon FZ1500R33HL3 IGBT model

| Parameter | Initial value | Extraction value of this invention |
|---|---|---|
| $W_L$/cm | 0.044 | 0.048 |
| $\tau_L$/S | 5 × 10$^{-6}$ | 6.5 × 10$^{-6}$ |
| $V_{th}$/V | 5.8 | 6 |
| $C_{GS}$/F | 1.2 × 10$^{-9}$ | 2.5 × 10$^{-9}$ |
| $C_{OXD}$/F | 5 × 10$^{-8}$ | 7.8 × 10$^{-8}$ |
| $\tau_H$/S | 5 × 10$^{-7}$ | 3 × 10$^{-7}$ |
| $K_p$/A/V$^2$ | 3.0 | 5.0 |
| a($\tau_L$) | 1.5 | 1.0 |
| a($\tau_H$) | 1.5 | 1.0 |
| C | −1.5 | −1.0 |

TABLE 3

Comparison of the parameter extraction effect of Infineon FZ1500R33HL3 IGBT module physical model

| | Junction Temperature | | | | | |
|---|---|---|---|---|---|---|
| | 25° C. | | | 125° C. | | |
| Comparison item | Simulation result based on the initial value | Simulation result based on the extraction value of this invention | Test value | Simulation result based on the initial value | Simulation result based on the extraction value of this invention | Test value |
| $t_{don}$/μs | 0.21 | 0.52 | 0.5 | 0.55 | 0.52 | 0.5 |
| $t_r$/μs | 0.2 | 0.54 | 0.55 | 0.8 | 0.57 | 0.55 |
| $t_{doff}$/μs | 2.35 | 3.7 | 4.1 | 3.128 | 4.345 | 4.3 |
| $t_f$/μs | 0.21 | 0.36 | 0.4 | 0.48 | 0.36 | 0.4 |
| $E_{on}$/mJ | 1222.8 | 2389.3 | 2300 | 1617.1 | 3264.7 | 3200 |
| $E_{off}$/mJ | 1146.6 | 2579.3 | 2400 | 1923.1 | 3100 | 2950 |

The invention claimed is:

1. An insulated gate bipolar transistor (IGBT) physical model parameter extraction method, comprising: obtaining an initial value and a transformation range of an IGBT physical model parameter; and correcting a model parameter according to a correspondence between IGBT dynamic and static features and the IGBT physical model parameter and in combination with an experiment measurement result of the IGBT physical model parameter; wherein:
the IGBT dynamic and static features under a typical working condition are obtained from a data handbook; a typical value of the relevant parameter of an IGBT physical model is obtained by a theoretical calculation; and a reasonable variation range of the typical value of the IGBT physical model parameter is obtained according to a semiconductor physical mechanism;
the calculation of the initial value and reasonable range of the IGBT physical model parameter comprises:
(1) base doping concentration $N_L$:

$$N_L = 1.932 \times 10^{18} V_B^{-1.4}; \qquad \text{symmetrical structure(1-a)}$$

$$V_B = W_L \left[ \frac{2qN_L(8 \times 10^3 N_L^{-0.75})}{\varepsilon_{Si}\varepsilon_0} \right]^{\frac{1}{2}} - \frac{qN_L W_L^2}{2\varepsilon_{Si}\varepsilon_0}; \qquad \text{asymmetrical structure (1-b)}$$

in which, $V_B$ represents a forward breakdown voltage of a collector-emitter of IGBT, $W_L$ represents a base width, q represents an electron charge constant, $\varepsilon_{si}$ represents a relative permittivity of silicon, and $\varepsilon_0$ represents a permittivity of air;

(2) base width $W_L$:

$$W_L = 2.67 \times 10^{10} \cdot N_L^{-\frac{7}{8}}; \qquad (2)$$

(3) lifetime of excess carrier in a base region $\tau_L$:

$$\tau_L = \frac{t_{off}}{\ln[10\alpha_{pnp}]}; \qquad (3)$$

$$\alpha_{pnp} = \mathrm{sech}\left(\frac{W_L}{L_L}\right); \qquad (4)$$

in which, $\alpha_{pnp}$ represents a common base current amplification factor of parasitic PNP transistor in the IGBT, $t_{off}$ represents a current turn-off time of IGBT, $L_L$ represents a hole diffusion coefficient of the base region;

(4) trans-conductance coefficient $K_p$:

$$K_p = \frac{2 \times I_{MOS}^{sat}}{(V_{GS} - V_{th})^2}; \qquad (5)$$

$$I_{MOS}^{sat} = \frac{I_{CE}^{sat}}{1 + \beta_{ss}}; \qquad (6)$$

$$\beta_{ss} = \frac{\frac{1}{b}P_0 + Q_1\left(\frac{1}{b} + \frac{1}{\cosh\left(\frac{W(t)}{L_L}\right)}\right)}{P_0 + Q_1\left(1 - \frac{1}{\cosh\left(\frac{W(t)}{L_L}\right)}\right)}; \qquad (7)$$

in which, $P_0$ represents a concentration of the excess carrier of the base region near an edge of a collector PN junction, $Q_1$ represents an equivalent carrier charge of the base region, $I_{MOS}^{sat}$ represents a saturation current of MOSFET, $V_{GS}$ represents a gate-emitter voltage of IGBT, $V_{th}$ represents a threshold voltage of IGBT, $I_{CE}^{sat}$ represents an on-state current of IGBT, $\beta_{ss}$ represents an equivalent current amplification coefficient of IGBT, W(t) represents a quasi-neutral base width, b represents a ratio of electron mobility to hole mobility, and $L_L$ represents a hole diffusion coefficient of the base region; $K_p$ is obtained by putting $V_{GS}$, $V_{th}$ and $I_{CE}^{sat}$ into the formulas, $I_{CE}^{sat}$ and the corresponding $V_{GS}$ is obtained from a device data handbook;

(5) gate oxide layer capacitance $C_{OXD}$:
according to a junction capacitance expression, an initial value of a gate-collector capacitance $C_{GDJ}$ is estimated firstly, and then an initial value of the gate oxide layer capacitance $C_{OXD}$ is obtained through a Miller capacitance $C_{GD}$, and the Miller capacitance $C_{GD}$ is obtained from the data handbook;

(6) gate-emitter capacitance $C_{GS}$:
the gate-emitter capacitance $C_{GS}$ is approximately equal to the difference between an input capacitance $C_{ies}$ of IGBT and a feedback capacitance $C_{res}$ of IGBT, and an initial value and reasonable order of magnitude of the gate-emitter capacitance $C_{GS}$ are calculated by formula (8), wherein the feedback capacitance $C_{res}$ and the input capacitance $C_{ies}$ are directly obtained from the data handbook:

$$C_{GS} = C_{ies} - C_{res} \qquad (8);$$

(7) other model parameters:
an initial value and reasonable correction range of the threshold voltage $V_{th}$ are obtained from the data handbook, and a structure size parameter is obtained by physical measurement; according to the information disclosed by an IGBT manufacturer, a reference concentration of a buffer layer $N_H$, the lifetime of the excess carrier of the buffer layer $\tau_H$ and a reasonable order of magnitude of a buffer layer width $W_H$ are obtained; a lifetime of minority carrier in the buffer layer of IGBT is determined by a doping concentration of the carrier; when a dispersion range of a semiconductor process parameter is put into a calculation formula of an initial value of the parameter, the variation range of the initial value of the model parameter is obtained, so that the initial value of the model parameter and its reasonable range are determined.

2. The method of claim 1, wherein the correspondence between the IGBT physical model parameter and the IGBT dynamic and static features is determined by analyzing an influence law and degree of the IGBT physical model parameter and a temperature on the IGBT dynamic and static features.

3. The method of claim 2, wherein
the IGBT physical model parameter related to temperature is calculated by the following temperature empirical formulas:

$$\tau(T_j) = \tau(T_0) \times \left(\frac{T_j}{T_0}\right)^a; \tag{12}$$

$$V_{th}(T_j) = V_{th}(T_0) - b \times (T_j - T_0); \tag{13}$$

$$K_p(T_j) = K_p(T_0) \times \left(\frac{T_j}{T_0}\right)^c; \tag{14}$$

$$I_{sne}(T_j) = \frac{I_{sne}(T_0) \times \left(\frac{T_j}{T_0}\right)^d}{\exp\left[(1/T_j - 1/T_0) \times e \times 10^4\right]}; \tag{15}$$

in which, a, b, c, d, and e are temperature coefficients related to actual operation characteristics, and a, b, c, d, and e are determined according to an actual device; $\tau(T_0)$, $V_{th}(T_0)$, $K_p(T_0)$ and $I_{sne}(T_0)$ represent the lifetime of excess carrier $\tau$, the threshold voltage $V_{th}$, the trans-conductance coefficient and an electron saturation current of the emitter at a temperature of $T_0$, respectively; $\tau(T_j)$, $V_{th}(T_j)$, $K_p(T_j)$ and $I_{sne}(T_j)$ represent the values of the aforementioned physical parameters at a temperature of $T_j$, respectively; To is usually equal to 25° C., and $T_j$ represents an actual operating junction temperature.

4. The method of claim 1, wherein in combination with the experiment measurement result of the IGBT physical model parameter, the IGBT physical model parameter is first corrected according to the dynamic and static features that are only affected by a single parameter, and then the IGBT physical model parameter is sequentially corrected starting from a dominant parameter according to the dynamic and static features affected by a coupling of multiple IGBT physical model parameters, and a temperature coefficient of the IGBT physical model parameter is corrected according to the variation of the dynamic and static features under different temperatures, and at last, a correction result of the IGBT physical model parameter under different temperatures is obtained and the extraction of the model parameter is finished.

5. The method of claim 4, wherein on the basis of the initial value and reasonable range of the IGBT physical model parameter, the model parameter is corrected at a temperature of 25° C. according to the influence trend and degree of the IGBT physical model parameter on IGBT switching transient characteristics; according to an approximate linear relationship between the IGBT transient characteristics and the temperature, a temperature empirical formula inside the model is corrected at a temperature of 125° C., so that the IGBT physical model parameter accurately represents the IGBT switching transient characteristics within an entire temperature range.

6. The method of claim 5, wherein the IGBT dynamic and static features that are least affected by a coupling of the model parameter are preferentially chosen, and then the IGBT physical model parameter that have a greater impact on the IGBT dynamic and static features is preferentially corrected, so that the IGBT switching transient characteristics represented by the model having the corrected parameter are closer to the value recorded in the data handbook at a temperature of 25° C.; the IGBT dynamic and static features that are least affected by a coupling of the temperature-related model parameter are preferentially chosen to correct the temperature coefficient.

7. The method of claim 6, wherein the corrected model parameter is excluded, and for the rest IGBT dynamic and static features to be adjusted, the characteristics that have the least coupling relationship with the parameter are chosen to perform the next parameter correction; when the IGBT dynamic and static features meet the requirements within a reasonable range for the first time, the correction of the IGBT physical model parameter is terminated immediately.

8. The method of claim 1, wherein the model parameters that affect a turn-on delay $t_{don}$ are the gate-emitter capacitance $C_{GS}$, the threshold voltage $V_{th}$ and the Miller capacitance $C_{GD}$; the model parameters that affect a current rise time $t_r$ are the trans-conductance coefficient $K_p$, the threshold voltage $V_{th}$, the gate-emitter capacitance $C_{GS}$ and the base doping concentration $N_L$; the model parameters that affect a turn-off delay $t_{doff}$ are the gate-emitter capacitance $C_{GS}$, the threshold voltage $V_{th}$, the trans-conductance coefficient $K_p$ and the gate oxide layer capacitance $C_{OXD}$; the model parameters that affect a current fall time $t_f$ are the lifetime of excess carrier in the buffer layer $\tau_H$, the lifetime of excess carrier in the base region $\tau_L$, the width of the buffer layer $W_H$, the base width $W_L$ and the base doping concentration $N_L$.

* * * * *